United States Patent [19]

Misiano et al.

[11] Patent Number: 5,135,778
[45] Date of Patent: Aug. 4, 1992

[54] REMOVABLY ATTACHABLE FORE-CHAMBER FOR SEQUENTIALLY REGISTERING SUBSTRATES WITH AN OPENING IN A VACUUM TREATMENT CHAMBER AND PROCESS OF OPERATION

[75] Inventors: Carlo Misiano; Enrico Simonetti, both of Rome, Italy

[73] Assignee: Consorzio Ce.Te.V Centro Tecnologie del Vuoto, Carsoli-L'Aquila, Italy

[21] Appl. No.: 537,477

[22] Filed: Jun. 13, 1990

[30] Foreign Application Priority Data

Sep. 11, 1989 [IT] Italy ............................. 48351 A/89

[51] Int. Cl.$^5$ ............................................ C23C 16/00
[52] U.S. Cl. .................... 427/248.1; 118/715; 118/719; 118/730; 118/733
[58] Field of Search ............... 118/719, 730, 733, 715; 414/217; 427/38, 39, 248.1

[56] References Cited

U.S. PATENT DOCUMENTS 3,428,197 2/1969 Fischer et al. .................. 414/217
4,548,699 10/1985 Hutchinson et al. ............. 414/217
4,634,331 1/1987 Hertel .............................. 414/217
4,938,858 7/1990 Zejda .............................. 414/217

Primary Examiner—Shrive Beck
Assistant Examiner—Terry J. Owens
Attorney, Agent, or Firm—Herbert Dubno

[57] ABSTRACT

Apparatus and process for loading substrates into an evacuable fore-chamber and registering the substrates with an opening in a vacuum treatment chamber to which the fore-chamber is attached. The fore-chamber is removably attached to a an external surface of a wall of the vacuum treatment chamber such that an opening in a wall of the fore-chamber is registered with an opening in the wall of the vacuum treatment chamber. A rotatable plate lying along the wall of the fore-chamber has a plurality of substrate holders each dimensioned to register with the opening in the vacuum treatment chamber. Rotation of the plate enables sequential exposure of the substrates to the vacuum treatment chamber for treatment without breaking the vacuum in the vacuum treatment chamber.

2 Claims, 2 Drawing Sheets

REMOVABLY ATTACHABLE FORE-CHAMBER FOR SEQUENTIALLY REGISTERING SUBSTRATES WITH AN OPENING IN A VACUUM TREATMENT CHAMBER AND PROCESS OF OPERATION

FIELD OF THE INVENTION

The present invention concerns a device for the speedy loading of samples in a vacuum plant and particularly in laboratories where setting up operations and processes for deposition and treatment both for research and production are carried out.

The invention can be embodied in a fore-chamber applied to the wall of any vacuum chamber.

The aforesaid fore-chamber is equipped with a closing plate supplied with concave or flat slots, that are to contain the substrates to be treated. The substrates, once laid in the fore-chamber, are introduced into the vacuum chamber simply by rotating the closing plate.

This means that the evacuating process is carried out only in the fore-chamber which is of reduced dimensions, while the vacuum chamber, once evacuated, can be utilized for a long period without having to be evacuated after each cycle of treatment.

BACKGROUND OF THE INVENTION

According to traditional techniques, a vacuum treatment process for substrates was as follows:

Loading into the vacuum chamber one or more substrates that are to be treated under different conditions according to the requirements of the process.

On conclusion of the treatments, a successive cycle is initiated during which the vacuum chamber returned to atmospheric pressure, is opened.

Utilizing a fore-chamber of conventional type which, after its evacuation, allows insertion of the sample or samples into the vacuum chamber by mechanical movement.

During this old process, there were idle times during which the deposition operation was not working, or else it was necessary to use very expensive equipments.

Consequently, idle times and limited versatility, particularly during research phases and setting up of the processes were the most evident inconveniences encountered with the previous system. Besides it was not always possible, even at high cost, to retrofit a fore-chamber to an old plant.

SUMMARY OF THE INVENTION

The present invention resolves all the aforesaid inconveniences with a simple mechanical solution that permits a rapid passage from the fore-chamber to the vacuum chamber, through the rotation of the plate on which the pieces to be treated are placed.

It is very important to specify that the invention is described in the actual version preferred by the inventors, but that the invention can be realized with different configurations as far as it applies to any chamber for chemical-physics, processes, etc. both permanently and temporarily.

Besides, the fore-chamber evacuation, suitably connected, can be achieved with the same pumping machine that effects the evacuation of the vacuum chamber.

A device in the form of a vacuum fore-chamber, is known by the English expression "Load Lock".

BRIEF DESCRIPTION OF THE DRAWING

The above and other objects, features and advantages of the present invention will become more readily apparent from the following description, reference being made to the accompanying drawing in which.

SPECIFIC DESCRIPTION

Figure 1:
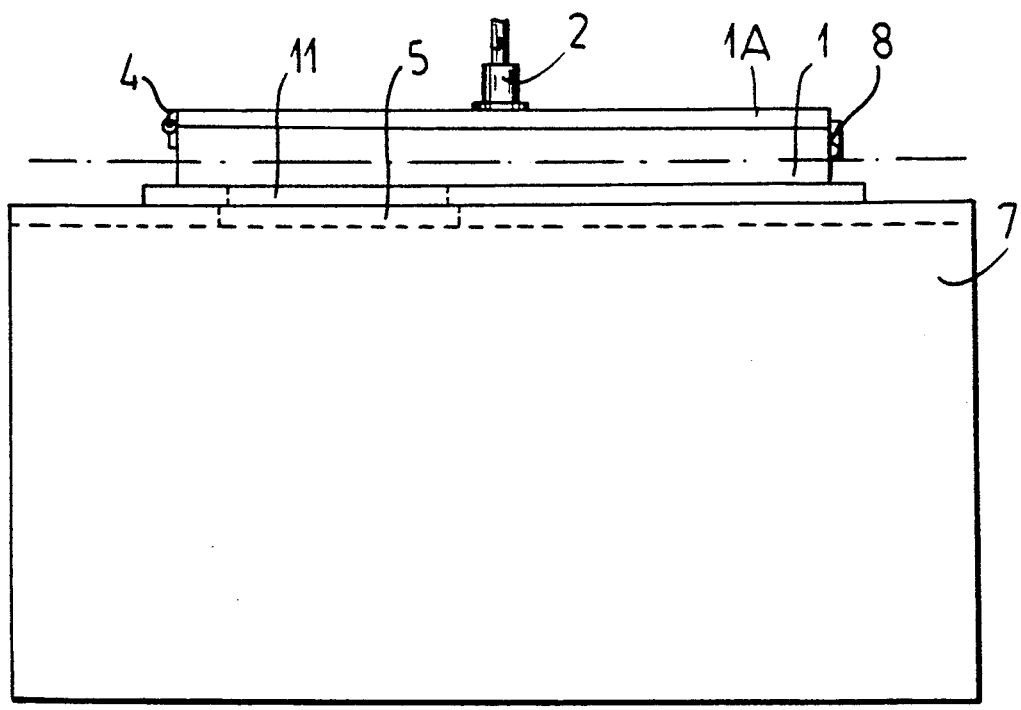
FIG. 1 is a side view of a vacuum chamber with the fore-chamber applied to the upper side.
Figure 2:
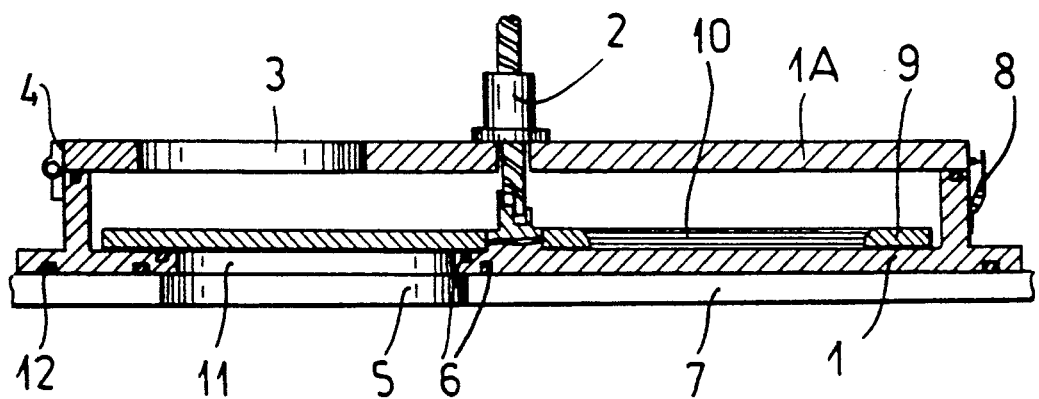
FIG. 2 is an axial section through the fore-chamber.

In the drawing an external housing body 1 has a cover 1A provided with a rotary feed-through 2, a pumping hole 3 and a hinge 4 connecting the cover to the housing 1. The latter has a communication hole to the chamber 7 and sealing O-rings 6 between the housing 1 and the chamber structure 7.

Figure 3:
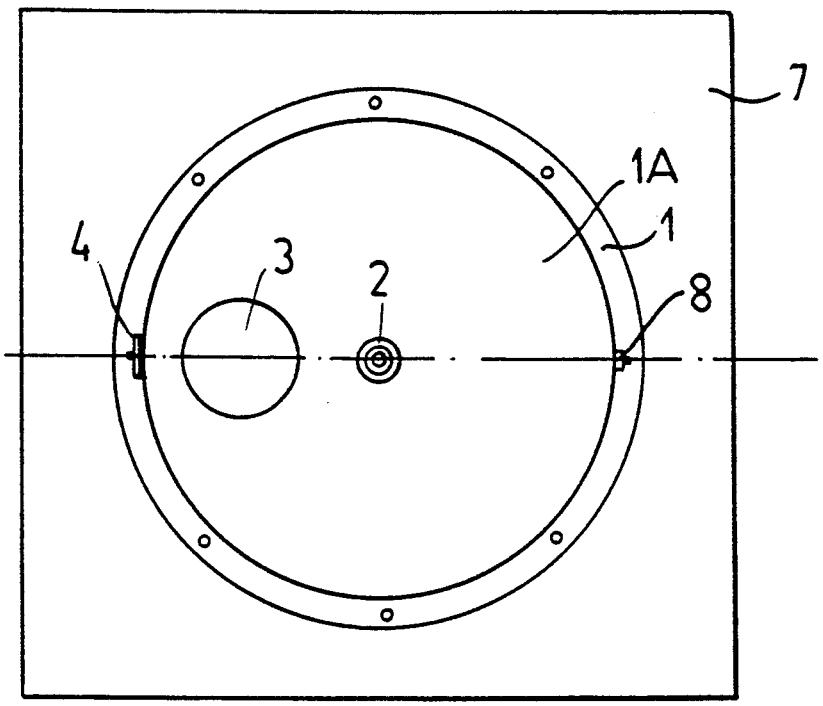
FIG. 3 is a plan view of the apparatus.
Figure 4:
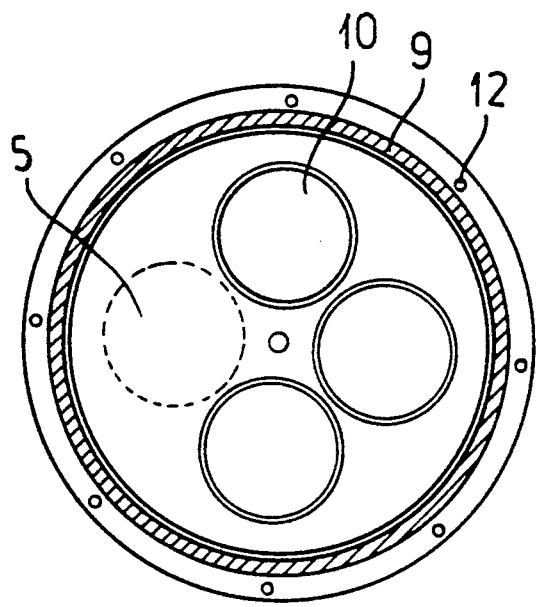
FIG. 4 is a horizontal section through the fore chamber.

A rapid closure 8 latches the cover 1A to the housing 1 and within the latter is an enclosure plate and substrate holder 9. Substrates holder housings 10 are formed on the plate 9. A connection hole 11 of the housing 1 communicates with the chamber 7. Fastening holes 12 allow connection of the housing 1 to the chamber 7. FIG. 3 is a view from the top of the closing plate, in which the cover 1A, the housing body 1, the rotary feed-through 2, the pumping hole 3, and the hinge 4 and the rapid closure or catch 8 are visible.

A hole 5 below the rotary plate, when it is not visible, effects the sealing closure.

The substrates are placed in the housings 10 of the enclosure plate 9 which is rotated to place each substrate for the respective cycle for the required time, on the communication chamber hole (5). Once the cycle is terminated the process continues immediately to the next substrate and so on.

The processing starts without requiring that the vacuum chamber returns to the atmospheric pressure from one substrate to the next.

The advantages of the fore-chamber of the invention are manifold. Some of the most significant are:

It may be considered an external apparatus that can be applied to and removed from any vacuum plant.

It is applicable to any vacuum plant or other similar apparatus.

It is particularly suitable for the setup of processes.

If it is equipped with an appropriate connection, it can be evacuated by the same pumping system that is used to evacuate the vacuum chamber.

It can also be used as a differential pumping chamber to analyze the gaseous residues in the environment.

It can be associated easily with a vacuum chamber or the like, even for a short period, then removed. This means that the same device can be used for a number of vacuum chambers.

We claim:

1. A method of operating a vacuum chamber, comprising the steps of:
   (a) removably attaching a fore-chamber over an opening in a wall of said vacuum chamber and on an external surface thereof, said fore-chamber having a wall provided with a communicating opening registering with said opening in said wall of said vacuum chamber, a rotatable plate lying along said wall of said fore-chamber and being capable of sealing said communicating opening, said plate having a plurality of holders each dimensioned to register with said communicating opening for successive positioning of said holders at said communicating opening by rotation of said plate, and fore-chamber cover means enabling insertion of substrates into said holders;

(b) inserting a respective substrate into each of said holders;

(c) evacuating said vacuum chamber;

(d) rotating said plate to position one of said holders in alignment with said communicating opening and juxtapose a respective substrate in the respective holder to the vacuum of said vacuum chamber;

(e) effecting a vacuum treatment of said respective substrate exposed to the vacuum of said chamber in a treatment cycle; and (f) without breaking the vacuum in said vacuum chamber, rotating said plate to align another of said holders of said plate with said communicating opening and repeating steps (e) and (f) until all of said substrates of said plate have been subjected to respective said treatment cycles.

2. An apparatus for vacuum treatment of substrates, comprising:

a vacuum chamber having a wall provided with an opening;

a fore-chamber comprising a housing having a wall with a communicating opening;

means for detachably mounting said fore-chamber on said wall of said vacuum chamber along an exterior thereof with said communicating opening in alignment with said opening of said wall of said chamber;

a rotatable plate lying along said wall of said fore-chamber and being capable of sealing said communicating opening, said plate having a plurality of holders each dimensioned to register with said communicating opening for successive positioning of said holders at said communicating opening by rotation of said plate;

a rotatable feedthrough connected to said plate and passing into said housing for rotating said plate; and fore-chamber cover means for inserting said substrates into respective holders of said plates, whereby, upon rotating of said plate to position one of said holders in alignment with said communicating opening and juxtapose a respective substrate in the respective holder to the vacuum of said vacuum chamber, a vacuum treatment of said respective substrate exposed to the vacuum of said chamber can be effected in a treatment cycle and without breaking the vacuum in said vacuum chamber, said plate being rotatable to align others of said holders of said plate with said communicating opening and repeat said treatment cycles until all substrates on said plate have been treated.

* * * * *